(12) United States Patent  (10) Patent No.: US 7,678,604 B2
Kim  (45) Date of Patent: Mar. 16, 2010

(54) METHOD FOR MANUFACTURING CMOS IMAGE SENSOR

(75) Inventor: Sang Sik Kim, Suwon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/476,223

(22) Filed: Jun. 26, 2006

(65) Prior Publication Data

US 2006/0292734 A1   Dec. 28, 2006

(30) Foreign Application Priority Data

Jun. 27, 2005   (KR) .............. 10-2005-0055639

(51) Int. Cl.
   *H01L 21/00* (2006.01)
(52) U.S. Cl. ............... 438/69; 438/70; 257/432; 257/E27.133; 257/E31.127
(58) Field of Classification Search .......... 438/26, 438/28, 29, 59, 60, 70, 71, 69; 257/89, 98, 257/290, 291, 292, 294, 432, 436, E27.133, 257/E31.121, E33.073, E31.127, E21.211
   See application file for complete search history.

(56) References Cited

U.S. PATENT DOCUMENTS 5,621,461 A * 4/1997 Higashide .............. 348/302
5,902,704 A * 5/1999 Schoenborn et al. ......... 430/5
6,069,350 A * 5/2000 Ohtsuka et al. ......... 250/208.1
6,632,700 B1 * 10/2003 Fan et al. ................. 438/70
6,656,762 B2   12/2003 Kim
6,794,215 B2 * 9/2004 Park et al. ................ 438/69
6,861,280 B2 * 3/2005 Yamamoto ............... 438/70
7,268,009 B2 * 9/2007 Hwang .................. 438/70
2003/0176010 A1 * 9/2003 Kim ..................... 438/70

FOREIGN PATENT DOCUMENTS

CN   1445816 A   10/2003
CN   1531100 A   9/2004
JP   06-112459 A   4/1994

OTHER PUBLICATIONS

People's Republic of China Office Action; Application No. 2006-10090550.2; Dated: Dec. 7, 2007; State Intellectual Property Office of People's Republic of China; People's Republic of China.

(Continued)

*Primary Examiner*—Khiem D Nguyen
(74) *Attorney, Agent, or Firm*—The Law Offices of Andrew D. Fortney; Andrew D. Fortney

(57) ABSTRACT

Disclosed is a CMOS image sensor and a method for manufacturing a CMOS image sensor. The method includes: (a) forming a resist film on a semiconductor substrate comprising a light sensing part, a protecting layer over the light sensing part, and an exposed bonding pad; (b) forming a color filter array on the thin resist film; (c) forming a plurality of microlenses over the color filter array; and (d) etching the resultant structure until the bonding pad is exposed.

19 Claims, 7 Drawing Sheets

OTHER PUBLICATIONS

Takahisa, Ueno; On-Chip Lens and Manufacture Thereof; Patent Abstracts of Japan; Publication No. 06-112459; Publication Date: Apr. 22, 1994; Japan.

Huawei Semiconductor Co., Ltd.; Image Sensor for Microlens with Integrated Filter Layer and Producing Method Thereof; SIPO Patent Search Engine; Publication No. 1531100 (Abstract Only); Publication Date: Sep. 22, 2004; State Intellectual Property Office of the People's Republic of China; People's Republic of China.

Kim, Chae-Gap; Method for Manufacturing Semiconductor Device Suitable for Image Sensor; SIPO Patent Search Engine; Publication No. 1445816 (Abstract Only); Publication Date: Oct. 1, 2003; State Intellectual Property Office of the People's Republic of China; People's Republic of China.

* cited by examiner

METHOD FOR MANUFACTURING CMOS IMAGE SENSOR

BACKGROUND OF THE INVENTION

1. Field of the Invention

The present invention relates to a method for manufacturing a semiconductor device, and more specifically, to a method for manufacturing a complementary metal oxide semiconductor (CMOS) image sensor.

2. Description of the Related Art

An image sensor, as a kind of semiconductor device, transforms optical images into electrical signals. Image sensors can be generally classified into charge coupled devices (CCDs) and CMOS image sensors. Among these image sensors, a CMOS image sensor comprises a photo diode for detecting incident light and transforming it into electrical signals, and logic circuits for transmitting and processing the electrical signals.

In processes for manufacturing a CMOS image sensor, it is desired to increase a so-called fill factor, defined as a ratio of light sensing area to total image sensor area, for the purpose of improving light sensitivity. However, since the light sensing part is formed only in an area other than the area where logic circuits are formed, there are limits to improving the fill factor of the device. For such reason, forming a plurality of microlenses on or over color filters of a CMOS image sensor has been widely employed as one alternative light condensing technique for changing a path of light incident on regions other than the light sensing part and concentrating light to the light sensing part.

A conventional method for manufacturing a CMOS image sensor including microlenses is hereinafter described referring to FIGS. 1a to 1d.

A conventional CMOS image sensor comprises: a light sensing part 13 including a photo diode 11 for accepting incident light, and for generating and accumulating electric charges; a protecting layer 21 formed on a structure of the light sensing part; color filter arrays 23; a planarization layer 25; and a plurality of microlenses 27.

In a conventional method of manufacturing such structured CMOS image sensor, as shown in FIG. 1a, the protecting layer 21 with a silicon nitride base is formed on a semiconductor substrate 10 that comprises the light sensing part 13 including the photo diodes 11, and on a wiring bonding pad 15. Then, as shown in FIG. 1B, a portion of the protecting layer 21 on the wiring bonding pad 15 is removed, exposing an upper surface of the wiring bonding pad 15. This opening process generally involves a photolithography process. More specifically, a photoresist material is applied and patterned on the protecting layer 21, then a portion of the protecting layer 21 is etched and removed to expose the wiring bonding pad 15. Afterwards, a remaining photoresist material is removed using a reactive ion etch.

Next, as shown in FIG. 1b, the color filter array 23 is formed on the protecting layer 21. Here, the color filter array 23 is formed in a primary color system, i.e., including a red filter (R), a green filter (G), and a blue filter (B), using photoresist materials containing a red, green, or blue pigment, respectively. Formation of each color filter involves a series of coating, exposure and development processes according to the photolithography technique. Alternatively, the color filter array can be formed in a complementary color system including cyan, yellow, and magenta filters.

Then, as shown in FIG. 1c, the planarization layer 25 is formed on the color filter array 23. The planarization layer 25 removes steps (uneven horizontal surfaces) in the topography between the color filters 23, thus enabling uniform formation of microlenses. In addition, a thickness of the planarization layer 25 is controlled so that a focal length is adjusted appropriately. The planarization layer 25 can comprise a photoresist, oxide, or nitride base material.

Next, a photoresist layer is applied, exposed, and developed on the planarization layer 25, thus forming a plurality of photoresist patterns. These photoresist patterns are thermally reflowed and cured to form a lens, thus resulting in a plurality of microlenses 27 shown in FIG. 1d.

According to the above-described conventional method, the remaining photoresist material in the bond pad opening process is ashed by a reactive ion etch. Thus, surface properties of the protecting layer 21 can be locally changed according to the conditions (ambient and other) in the ashing process. As a result, adhesion of color photoresist on the protecting layer 21 may deteriorate so that some of the patterned color filters peel off. In general, the color filter array 23 is formed of organic materials. Especially, in the case where the color photoresist contains a large amount of pigment, the peeling phenomenon may occur more frequently because of relatively large-sized pigment particles affecting adhesion to the protecting layer 21. There is a need in the art to solve the peeling problems of the color filters because it can induce deterioration and/or failure of certain characteristics of the device (e.g., discoloration).

In the case where the peeling phenomenon occurs, the color filter array 23 and microlenses 27 may be reworked and reproduced by stripping one or more of the color filter array 23, the planarization layer 25, and the microlenses 27, and repeating the photolithography process(es) for the color filter array 23, the planarization layer 25, and the microlenses 27, up to several times. However, a developing solution used in the photolithography process generally comprises TMAH ((Tetramethylammonium hydroxide) which erodes the exposed wiring bonding pad 15. Therefore, the number of repetitions of the stripping and photolithography process is restricted. Moreover, several repetitions of the photolithography process can lead to contamination of wiring bonding pad 15, thus resulting in a wiring failure.

Meanwhile, according to the conventional method, the microlenses 27 are formed distant from each other by about 0.2 μm~0.5 μm, for the purpose of preventing formation of bridges between the microlenses 27 during the curing and reflowing processes of the corresponding photoresist pattern. However, the gap between microlenses 27 results in at least some loss of the light incident between microlenses 27, and especially a problem that the resolution of color signals may be less than optimal due to oblique light incident to adjacent pixels.

SUMMARY OF THE INVENTION

It is, therefore, an object of the present invention to provide a method for manufacturing a CMOS image sensor, wherein a bonding pad is protected by a thin resist film before formation of a color filter array, and the thin resist film covering the bonding pad is removed after formation of microlenses, thus inhibiting, suppressing or preventing the color filter array from peeling off.

Another object of the present invention is to provide a method for manufacturing a CMOS image sensor, in which unnecessary gaps between microlenses are reduced, minimized or eliminated, thereby improving the light condensing efficiency of the image sensor, and reducing or preventing adverse effects of oblique light incident to adjacent pixels, and ultimately enabling realization of more vivid colors.

It is still another object of the present invention to provide a method for manufacturing a CMOS image sensor having improved light sensitivity by improving the shape uniformity of the microlenses.

To achieve the above objects, an embodiment of a method for manufacturing a CMOS image sensor according to the present invention comprises the steps of: (a) forming a resist film on a semiconductor substrate comprising a light sensing part, a protecting layer over the light sensing part, and an exposed bonding pad; (b) forming a color filter array on the resist film; (c) forming a plurality of microlenses over the color filter array; and (d) etching the resultant structure until the bonding pad is exposed again.

Alternatively, a method for manufacturing a CMOS image sensor according to the present, can comprise the steps of: forming an organic material layer over an entire surface of the substrate, including a plurality of microlenses and a bonding pad; and etching the resultant structure until the bonding pad is exposed.

These and other aspects of the invention will become evident by reference to the following description of the invention, often referring to the accompanying drawings.

DETAILED DESCRIPTION OF THE INVENTION

Hereinafter, one embodiment of a manufacturing method for a CMOS image sensor according to the present invention will be described with reference to FIGS. 2a to 2f.

Figure 1A:
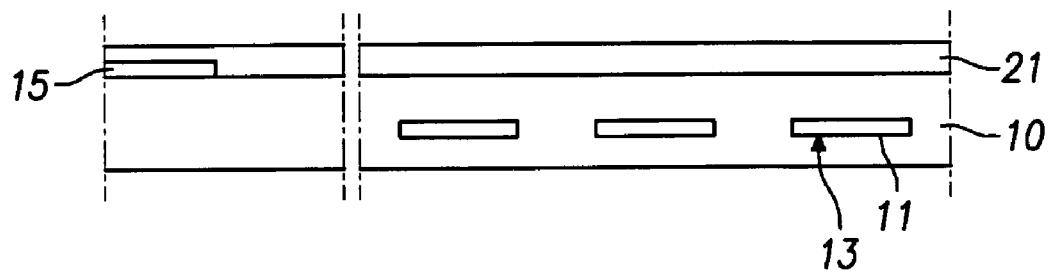
FIGS. 1a to 1d are cross-sectional views illustrating a conventional method for manufacturing a CMOS image sensor.
Figure 1B:
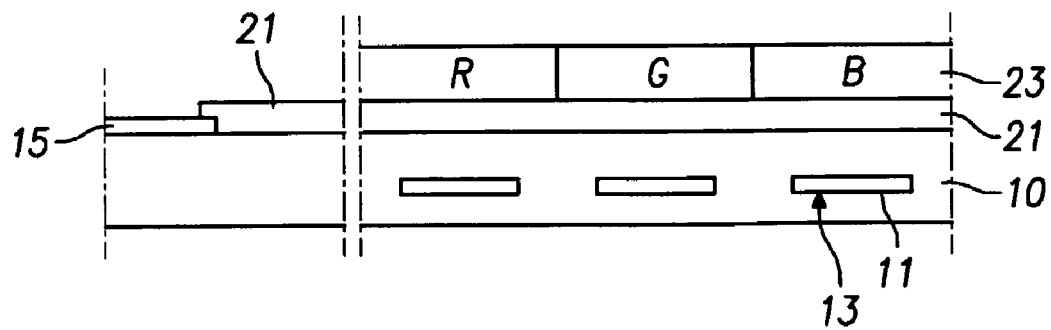
Figure 1C:
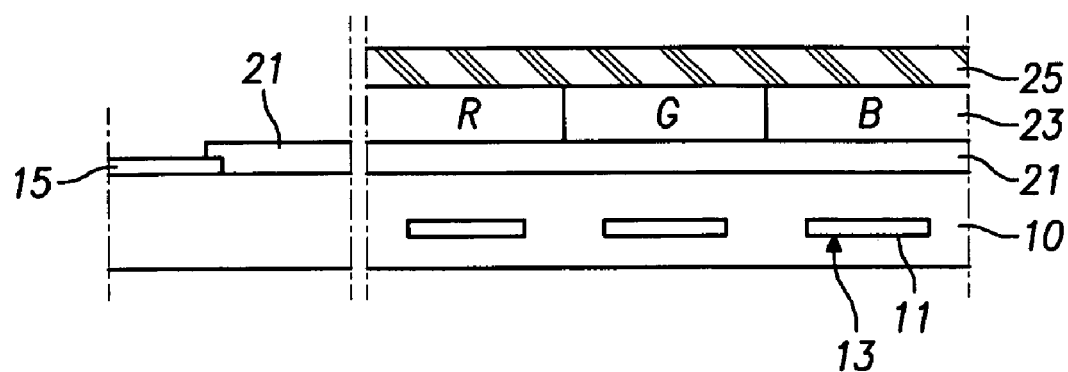
Figure 1D:
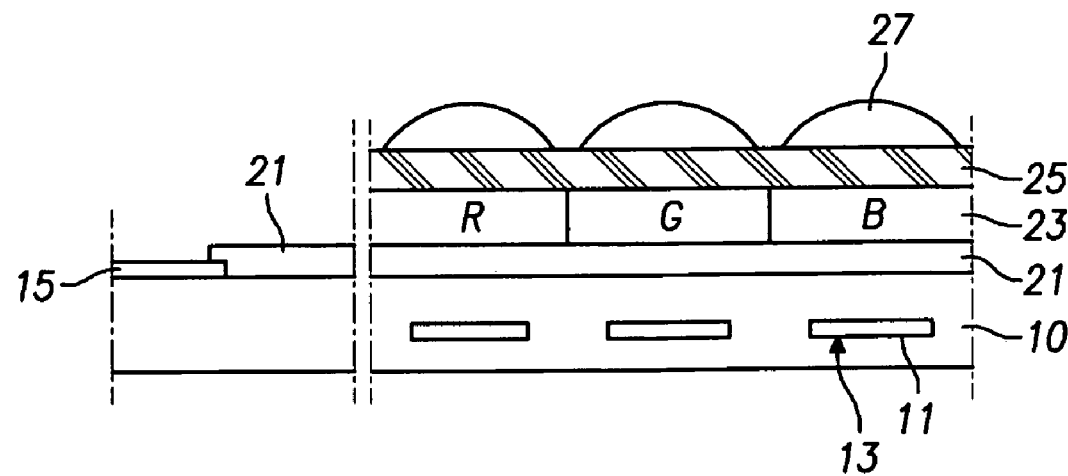
Figure 2A:
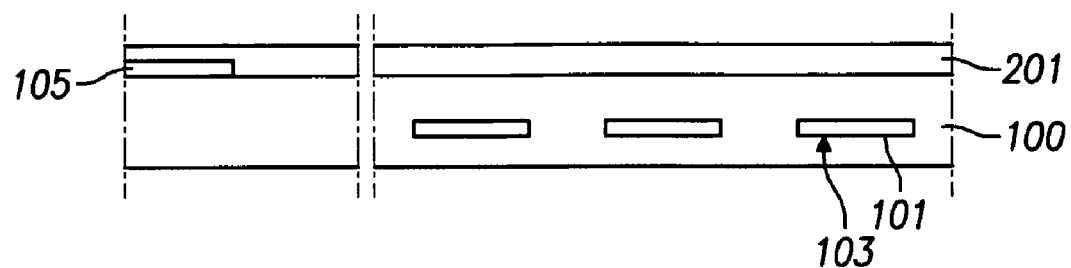
FIGS. 2a to 2f are cross-sectional views illustrating one embodiment of a method for manufacturing a CMOS image sensor according to the present invention.

Referring to FIG. 2a, a protecting layer 201 with a silicon nitride base (e.g., which may comprise silicon nitride) is formed on a semiconductor substrate 100 that comprises light sensing parts 103 including photo diodes 101, one or more metallization or wiring layers (not shown), and a bonding pad 105 (e.g., for attachment of a wire adapted for transferring electrical signals to and/or from the image sensor). Then, a portion of the protecting layer 201 on or over the bonding pad 105 is removed, thus exposing an upper surface of the bonding pad 105. This opening process of the bonding pad 105 is generally performed using a photolithography process. More specifically, a photoresist material is applied on the entire protecting layer 201 (e.g., spin-coated onto the entire substrate) and patterned (e.g., by conventional irradiation and development), then a portion of the protecting layer 201 (e.g., at least the portion over bonding pad 105) is etched and removed. The remaining photoresist pattern is then removed (e.g., using a reactive ion etch and/or ashing process).

Figure 2B:
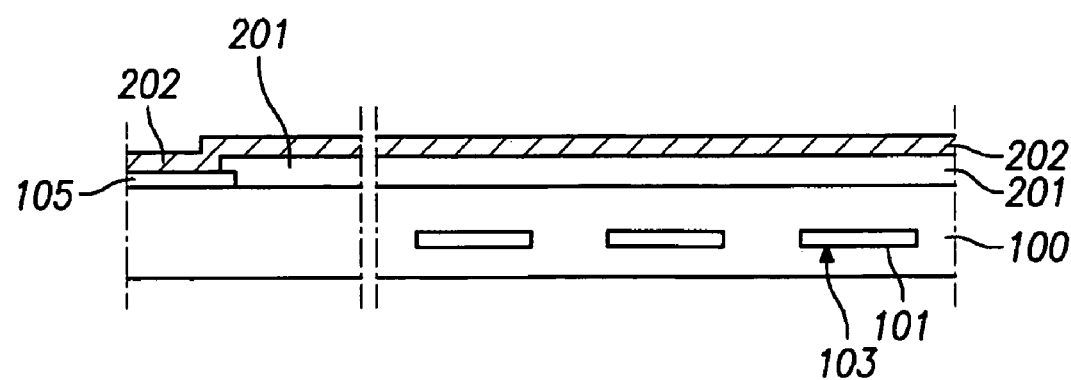

Next, as shown in FIG. 2b, a thin resist film 202 is formed on entire surfaces of the exposed bonding pad 105 and the protecting layer 201, thus covering the bonding pad 105. For example, the resist film 202, which can comprise an organic material, may have a thickness of not more than 50 nm (e.g., 10 to 50 nm). Thereafter, it is hard-cured. The resist film 202 functions as a protector for the bonding pad 105, and (optionally) as a planarization layer for improving the profile (e.g., the flatness or horizontal nature of the topography) and the uniformity of a color filter array 203 to be formed thereon in a subsequent process. It is preferable that the resist film 202 comprise an organic material base having a superior (or predetermined) transparency to visible light (e.g., at least 80%, 90%, or more). More preferably, the resist film 202 comprises a thermosetting resin, such as an acrylic resin, etc., that has little reactivity with the color filter array 203.

Figure 2C:
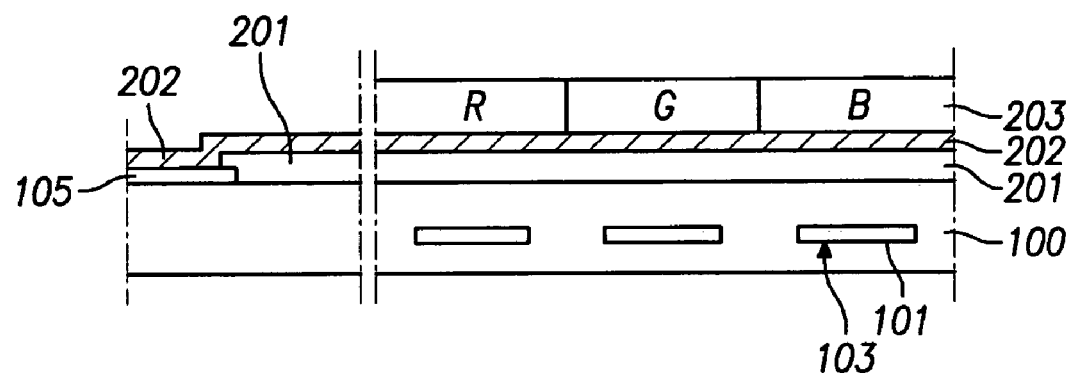

Thereafter, as shown in FIG. 2c, the color filter array 203 is formed on the protecting layer 202. Here, the color filter array 203 comprises a primary color system, i.e., including a red filter (R), a green filter (G), and a blue filter (B), using a photoresist material containing a red, green, and blue pigment, respectively. Formation of each color filter involves performing at least three times the photolithography process including coating, exposure and development of each individual photoresist material. The present embodiment exemplifies the primary color filter system, however, the color filter array can be alternatively formed in a complementary color system including cyan, yellow, and magenta filters.

Figure 2D:
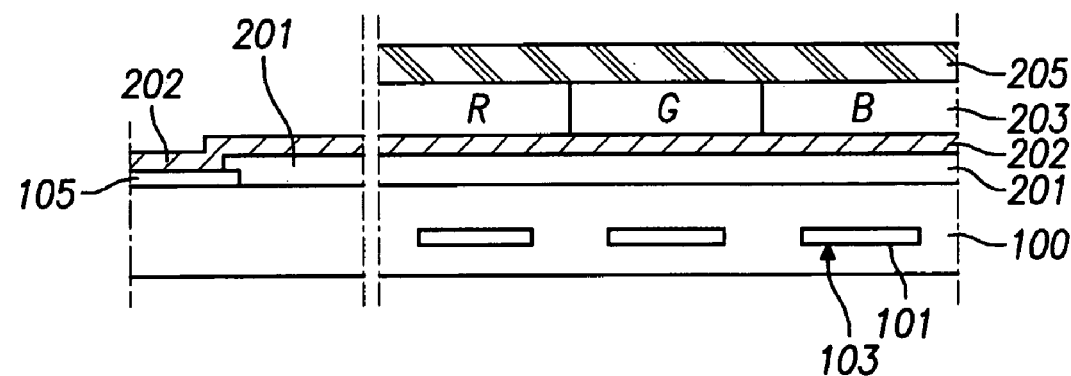

As shown in FIG. 2D, a planarization layer 205 is formed on the color filter array 203. The planarization layer 205 removes steps (e.g., differences in height across the substrate topography) between the color filters 203, thus enabling uniform formation of microlenses 207. In addition, the planarization layer 205 may have a thickness of about 0.5 μm~1.5 μm and may be selected so that a focal length of light passing through an overlying microlens is adjusted appropriately (e.g., to focus the light onto an underlying photodiode 101). The planarization layer 25 can comprise a photoresist, oxide, or nitride base material. The planarization layer 205 is an optional component and it may be omitted.

Figure 2E:
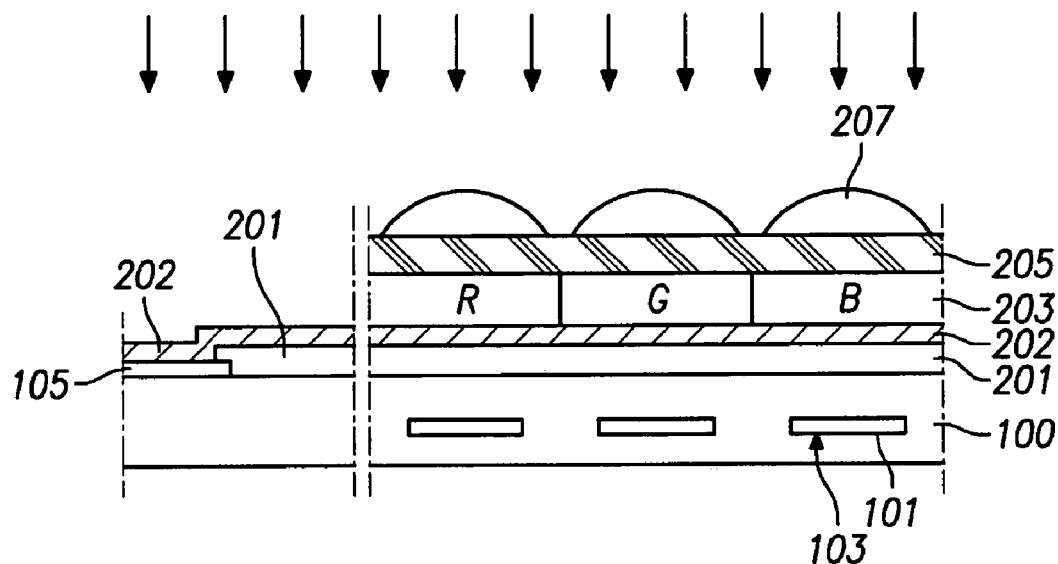

Next, a photoresist layer is applied, exposed, and developed on the planarization layer 205, thus forming a photoresist pattern (e.g., a plurality of microlens bodies). The photoresist pattern is bleached, thermally reflowed and cured to form lenses having a desired curvature, thus resulting in a plurality of microlenses 207 as shown in FIG. 2E.

Here, the number of microlenses 207 preferably relates to the number of pixels in the image sensor, and they have a size (e.g., area) as large as possible, in order to improve light sensitivity and condensing efficiency to incident light. However, it is difficult to uniformly fabricate so many (relatively) large microlenses because of morphology effects due to the underlying layer and photo effects in the microlenses. Therefore, gaps (e.g., 303) between the microlenses 207 should be formed to the extent that they can be controlled appropriately (e.g., reproduced within manufacturing tolerances or limits), as shown in FIGS. 2E and 2F.

Next, the substrate is etched (e.g., it undergoes a blank etch) using an oxygen ($O_2$) plasma or other plasma comprising an oxygen atom source (e.g., $O_3$, $N_2O$, NO, $CO_2$, etc., which may further contain a carrier gas or noble gas such as $N_2$, Ar, He, etc.) so that the portion of the resist film 202 covering the bonding pad 105 is removed, and simultaneously, the microlenses 207 may be etched. In this process, irregular tails (or "bridges") between microlenses 207 may also be removed, and gaps 303 between microlenses 207 may be shallow etched. Especially, regions 303 between microlenses 207 may be etched to in the form of a concave lens, thus resulting in "gapless" microlenses, as shown in FIG. 2f. Such plasma etching consequently enables maximizing the size of the microlenses, thereby enabling condensation of incident light to the photodiode by an amount approaching 100%. Furthermore, since the light sensitivity can be improved and an oblique light incident to adjacent pixels can be reduced or prevented, it is possible to realize clearer images using a CMOS image sensor manufactured according to the present invention.

Figure 2F:
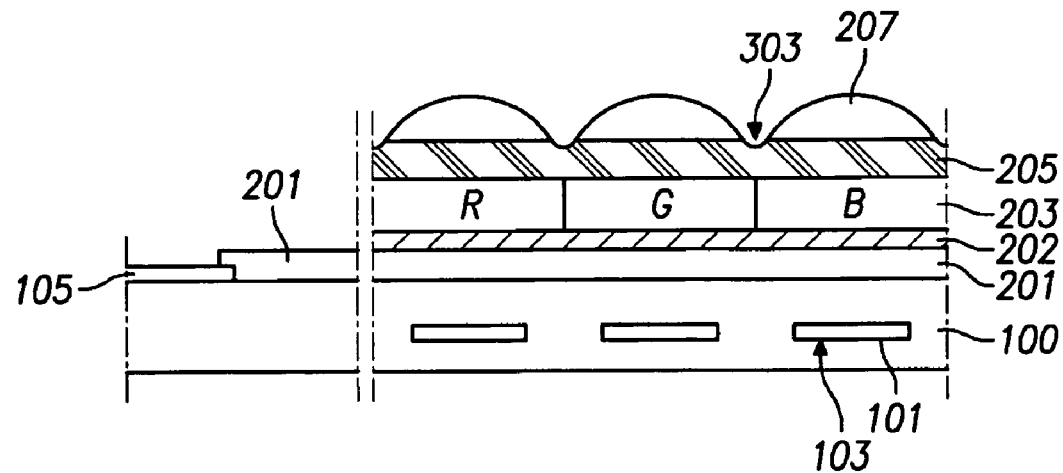
Figure 3A:
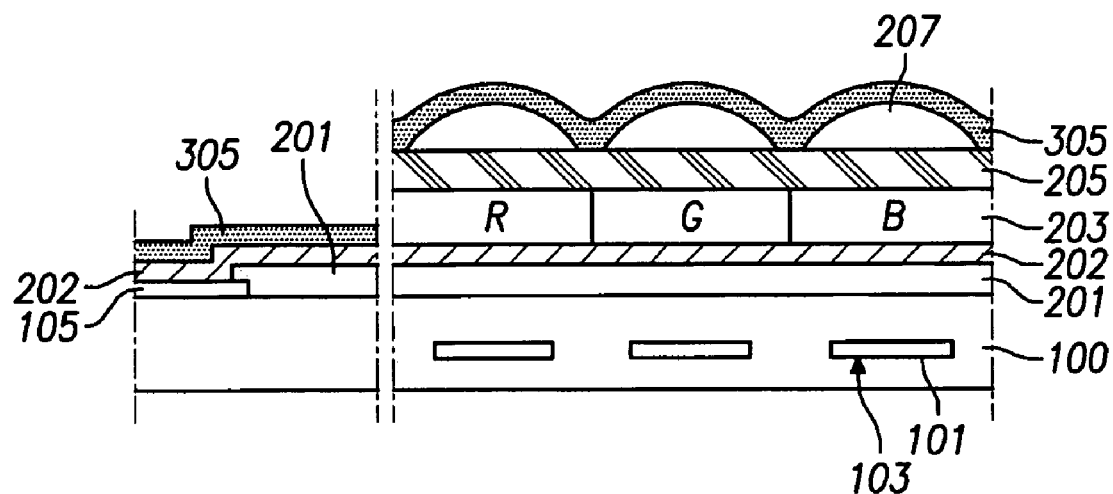
FIGS. 3a to 3c are cross-sectional views illustrating another embodiment of a method for manufacturing a CMOS image sensor according to the present invention.

Meanwhile, referring to FIG. 2f, the shallow etching of gaps 303 between microlenses 207 utilizes the difference of etching selectivity between the photoresist ingredients of microlenses 207 and the planarization layer 205. In the case where these two materials have a similar etching selectivity, an ideal concave form between microlenses may not form as readily as may be desired. In such case, as shown in FIG. 3a, it is preferable that an organic material layer 305 is further formed over the entire surface of the substrate before the etch process of FIG. 2F. The organic material layer 305 can comprise a photoresist or thermosetting resin, and it can have a thickness of about 30 nm~100 nm. Preferably, when using the organic material layer 305, the microlenses 207 may be irradiated with ultraviolet radiation to prevent an undesired reaction between the organic material layer 305 and microlenses 207.

Figure 3B:
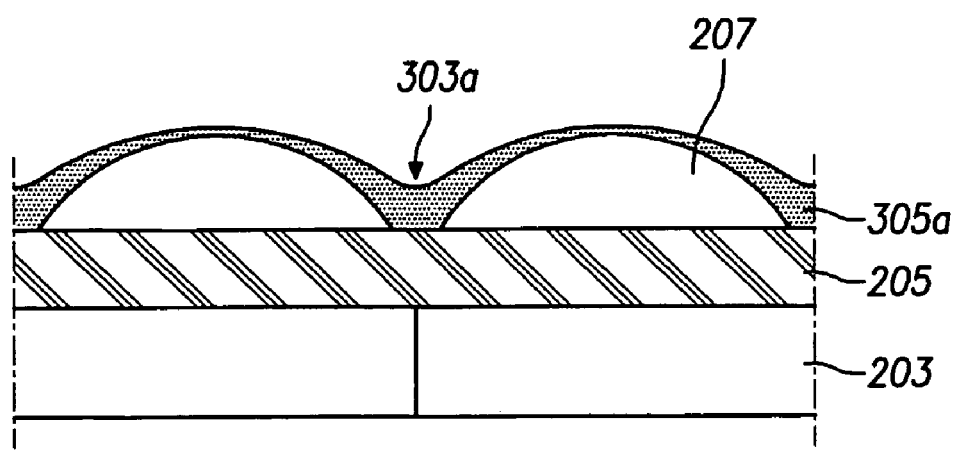
Figure 3C:
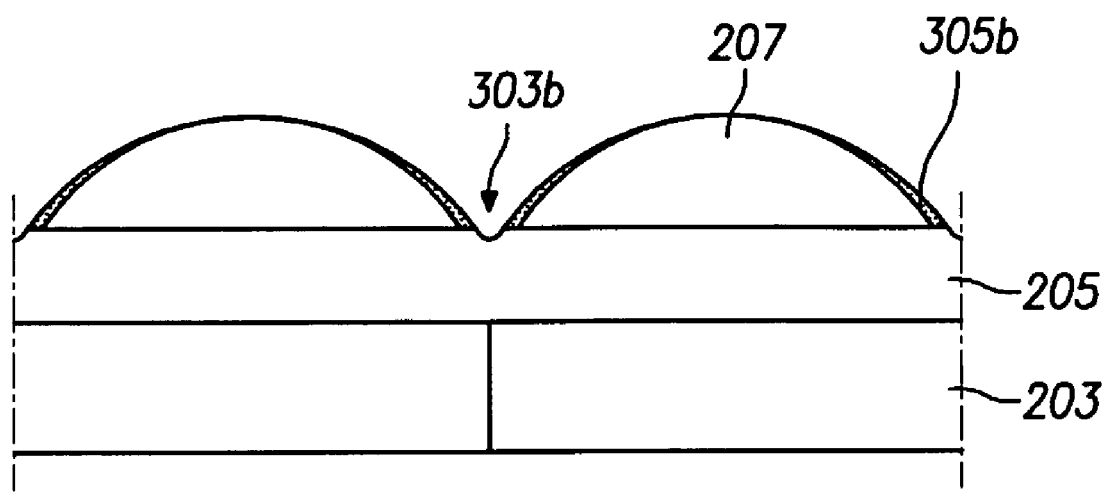

As shown in FIG. 3a, forming organic material layer 305 uniformly over the entire surface of the substrate, especially microlenses 207, can facilitate formation of the concave profiles between microlenses 207. More specifically, when the substrate is dry etched by an oxygen-containing plasma (e.g., a plasma comprising $O_2$) after forming the organic material 305, the concave profiles of the organic material layer 305 between microlenses can be maintained. Although the resist film 202 and the organic material layer 305 are both present on the bonding pad 105, the etch should proceed until the bonding pad 105 is exposed. For this reason, the amount of the organic material layer 305 remaining after the etch depends on the total thickness of the resist film 202. FIGS. 3b and 3c show the cases where the organic material layer remaining after the etch is present in different amounts. However, the operation of the CMOS image sensor is not affected in either case. For example, in the case where a relatively considerable amount of the organic material remains, as shown in FIG. 3b, the remaining organic material layer 305a still has a concave profile 303a between microlenses. In the other case where the organic material remains locally in a relatively small amount (and, e.g., where the planarization layer 205 is partially etched during the etching process), as shown in FIG. 3c, the region between microlenses still has a concave profile 303b.

According to the present invention, a resist film for protecting the bonding pad is formed over the bonding pads before forming the color filters and removed from the bonding pads after forming the microlenses, which enables a reduction and/or prevention of erosion of the bonding pad, as well as a change in surface properties of the protecting layer. As a result, the peeling phenomenon of the color filter array can be prevented. In addition, the present invention enables (a) improvement in shape uniformity of the microlenses and (b) formation of gapless microlenses. Moreover, the present invention has such advantages that the size of microlens can be maximized, thus the light sensitivity can be improved. Especially, using the organic material layer facilitates formation of a concave profile between microlenses.

While the invention has been shown and described with reference to certain preferred embodiments thereof, it will be understood by those skilled in the art that various changes in form and details may be therein without departing from the spirit and scope of the invention as defined by the appended claims.

What is claimed is:

1. A method for manufacturing a CMOS image sensor, comprising the steps of:

(a) forming a resist film on a protecting layer over a light sensing part of a semiconductor substrate and on an exposed bonding pad;

(b) forming a color filter array on the resist film;

(c) forming a planarization layer on the color filter array;

(d) forming a plurality of microlenses on the planarization layer; and (e) after forming the plurality of microlenses, etching the planarization layer and the resist film on the bonding pad until the bonding pad is exposed, all microlens material is removed between adjacent microlenses, and a concave profile is formed in the planarization layer between adjacent microlenses.

2. The method of claim 1, wherein the resist film comprises an organic material.

3. The method of claim 2, wherein the resist film has at least a predetermined transparency to visible light.

4. The method of claim 1, wherein the resist film comprises a thermosetting resin.

5. The method of claim 1, wherein the resist film comprises an acrylic resin.

6. The method of claim 1, wherein the resist film has a thickness not more than 50 nm.

7. The method of claim 1, wherein the etching step removes the resist film covering the bonding pad and forms a gap between the microlenses.

8. The method of claim 1, wherein the etching step comprises etching with a plasma comprising an oxygen source.

9. The method of claim 8, wherein the oxygen source comprises $O_2$.

10. The method of claim 1, wherein the microlenses comprise a second resist material, and etching the resist film simultaneously etches the microlenses until the concave profile is formed in the planarization layer.

11. The method of claim 1, further comprising, before the etching step, forming an organic material layer over an entire surface of the substrate including the plurality of microlenses, and wherein etching the planarization layer and the resist film further comprises simultaneously etching the organic material layer.

12. A method for manufacturing a CMOS image sensor, comprising the steps of:

(a) forming a resist film on a protecting layer over a light sensing part of a semiconductor substrate and on an exposed bonding pad;

(b) forming a color filter array on the resist film;

(c) forming a planarization layer on the color filter array;

(d) forming a plurality of microlenses on the planarization layer, wherein adjacent microlenses have a space therebetween exposing regions of the planarization layer;

(e) forming an organic material layer over an entire surface of the substrate including the plurality of microlenses; and (f) etching the organic material layer and the protecting layer on the bonding pad until the bonding pad is exposed and a concave profile is formed in the organic material layer and the planarization layer between adjacent microlenses.

13. The method of claim 12, wherein the organic material layer comprises a photoresist or a thermosetting resin.

14. The method of claim 12, wherein the organic material layer has a thickness of 30 nm~100 nm.

15. The method of claim 12, wherein the resist film comprises an organic material or a thermosetting resin having a predetermined transparency to visible light.

16. The method of claim 12, wherein the etching step removes the organic material layer and the resist film covering the bonding pad, and forms a gap between the micro lenses.

17. The method of claim 12, wherein the etching step utilizes a plasma comprising oxygen.

18. The method of claim 12, comprising the step of irradiating the plurality of microlenses with ultraviolet light before forming the organic material layer.

19. The method of claim 12, wherein the organic material layer comprises a second resist material, and etching the protecting layer simultaneously etches the microlenses until the concave profile is formed in the organic material layer.

* * * * *